United States Patent
Seroussi et al.

(10) Patent No.: US 8,750,062 B2
(45) Date of Patent: Jun. 10, 2014

(54) MEMORY ELEMENT AND METHOD FOR DETERMINING THE DATA STATE OF A MEMORY ELEMENT

(75) Inventors: Gadiel Seroussi, Cupertino, CA (US); Pascal Olivier Vontobel, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/383,602

(22) PCT Filed: Jul. 30, 2010

(86) PCT No.: PCT/US2010/044004
§ 371 (c)(1),
(2), (4) Date: Jan. 12, 2012

(87) PCT Pub. No.: WO2012/015438
PCT Pub. Date: Feb. 2, 2012

(65) Prior Publication Data
US 2013/0250708 A1    Sep. 26, 2013

(51) Int. Cl.
*G11C 11/14*  (2006.01)
*G11C 11/16*  (2006.01)
*G11C 13/00*  (2006.01)

(52) U.S. Cl.
CPC .......... *G11C 11/1673* (2013.01); *G11C 13/004* (2013.01); *G11C 13/0004* (2013.01)
USPC ...... 365/201; 365/148; 365/163; 365/189.07; 365/189.15

(58) Field of Classification Search
CPC ............. G11C 11/1673; G11C 13/004; G11C 13/0004
USPC ............ 365/201, 148, 158, 163, 171, 189.07, 365/189.15, 207
See application file for complete search history.

(56) References Cited

U.S. PATENT DOCUMENTS

| | | | |
|---|---|---|---|
| 7,380,179 B2 | 5/2008 | Gower et al. | |
| 7,944,760 B2 * | 5/2011 | Mayor | 365/189.15 |
| 8,223,539 B2 * | 7/2012 | Smythe et al. | 365/178 |
| 8,331,129 B2 * | 12/2012 | Yi et al. | 365/148 |
| 8,385,101 B2 * | 2/2013 | Yang et al. | 365/148 |
| 8,416,604 B2 * | 4/2013 | Kim et al. | 365/148 |
| 2002/0001226 A1 | 1/2002 | Banks | |
| 2008/0212374 A1 | 9/2008 | Guterman et al. | |
| 2009/0006931 A1 | 1/2009 | Djurdjevic et al. | |
| 2009/0016103 A1 | 1/2009 | Kang et al. | |
| 2009/0070651 A1 | 3/2009 | Diggs et al. | |
| 2009/0116325 A1 | 5/2009 | Jenkins et al. | |
| 2009/0241006 A1 | 9/2009 | Likanen et al. | |
| 2009/0244973 A1 | 10/2009 | Scheppler et al. | |
| 2009/0282308 A1 | 11/2009 | Gutsche et al. | |
| 2010/0037032 A1 | 2/2010 | Achter | |
| 2010/0080054 A1 * | 4/2010 | Abe | 365/171 |

* cited by examiner

Primary Examiner — Tan T. Nguyen

(57) ABSTRACT

One embodiment of the present invention is directed to an electronic memory comprising a memory element and control logic that determines a data state of the memory element by: measuring a physical characteristic of the memory element to obtain a measured value corresponding to the data state, measuring the physical characteristic of the memory element, after setting the memory element to a first known data state, to obtain a first calibration value, comparing the measured value corresponding to the data state with the first calibration value to determine the data state; and determining a reliability metric for the determined data state.

20 Claims, 8 Drawing Sheets

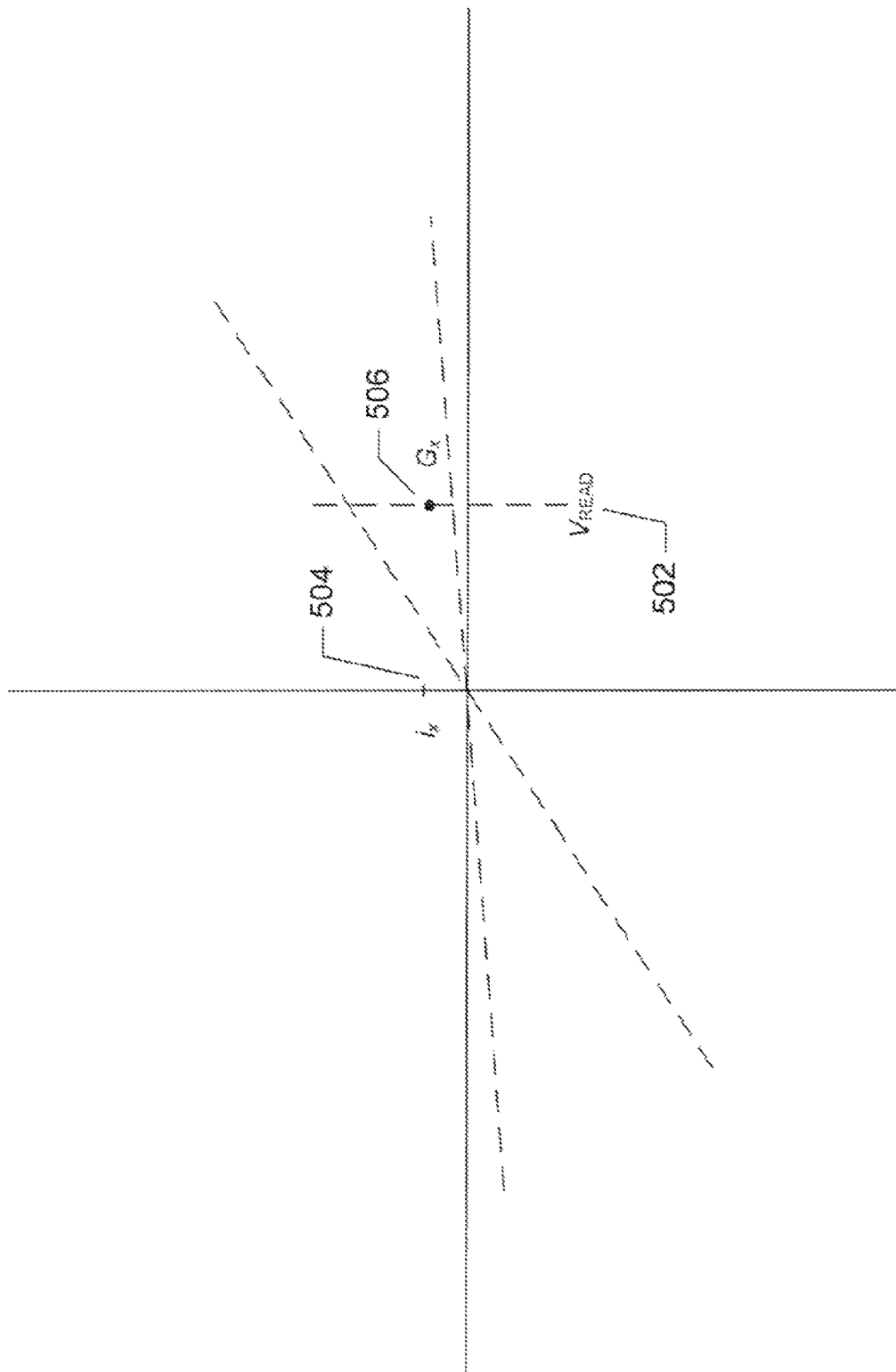

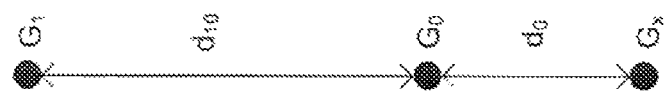
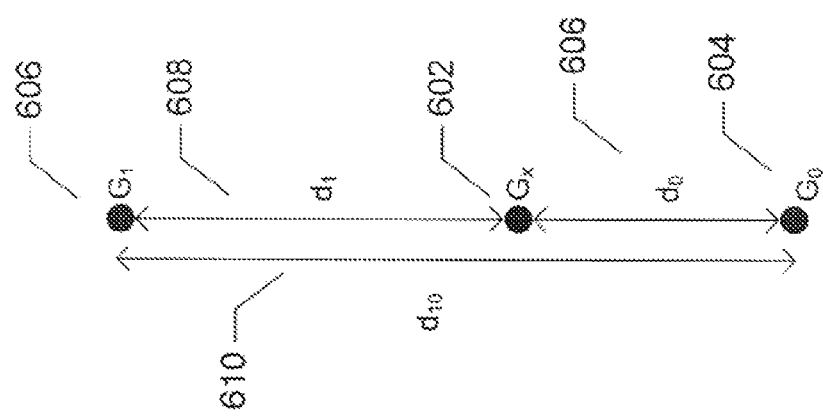
FIGURE 6C
FIGURE 6B
FIGURE 6A

MEMORY ELEMENT AND METHOD FOR DETERMINING THE DATA STATE OF A MEMORY ELEMENT

TECHNICAL FIELD

The present invention is related to electronic memory and, in particular, to a memory element used in electronic memory and methods for determining the data state of the memory element.

BACKGROUND

Recently, nanoscale memristive devices have been fabricated and incorporated into electronic memories, including crossbar memories. Memristors exhibit non-linear, bi-stable, hysteretic conductance characteristics that can be exploited for storing binary, values, or bits, within electronic memories and potentially for storing ternary, quaternary, or larger-base encodings of values in electronic memories based on elementary information-storing units having three, four, or more differentiable physical states. Such memories provide extremely high data-storage density, non-volatile data storage, and desirable levels of energy efficiency. However, as with any electronic device or subsystem that employs nanoscale components, memristor-based memories are also associated with physical imperfections, due to the difficulty in manufacturing nanoscale components, electronically accessing nanoscale components, and long-term drift and instabilities in physical characteristics of nanoscale components that can, in turn, lead to the occurrence of errors in storing and retrieving data from electronic memories based on nanoscale memristive memory elements. Researchers and developers of memristor-based memories, as well as manufacturers, vendors, and ultimately, users of electronic devices that incorporate memristor-based memories continue to seek memristive-memory-element-based memories with increased reliability. Methods and systems that increase reliability in memristive-memory-element-based memories may, in addition, be applied to additional types of electronic memories and even additional problem domains.

BRIEF DESCRIPTION OF THE DRAWINGS

FIGS. 5A-C illustrate a data-state-determination operation that represents one embodiment of the present invention.

FIGS. 6A-C illustrate three different possible orderings of the magnitudes of the determined conductances $G_x$, $G_0$, and $G_1$, discussed above with reference to FIGS. 5A-C, obtained during a data-state-determination operation that represents one embodiment of the present invention.

DETAILED DESCRIPTION OF THE INVENTION

Embodiments of the present invention include any of various electronic devices and subsystems that include memory elements and that employ a data-state-determination method embodiment of the present invention, implemented in logic circuits (e.g., 105, FIG. 1) and/or computer instructions executed by a microprocessor within the electronic devices and subsystems for determining the data state of memory elements. In one embodiment of the present invention, the initially unknown data state of a memory element is determined by first measuring the current passing through the memory element when an interrogation voltage is applied to the memory element, and then setting the data state of the memory element to each of the two binary data states "0" and "1" to determine the current that passes thorough the memory element, when the memory element is in the two binary data states "0" and "1." Using the three measured currents, the initially unknown data state of the memory element is computed and returned as the data state of the memory element. In certain embodiments of the present invention, a reliability metric R is also computed and returned, as a result of a data-state-determination operation. In yet additional embodiments of the present invention, the returned, determined data state may be one of the two binary data states "0" and "1" or a third, erasure data state.

Figure 1:
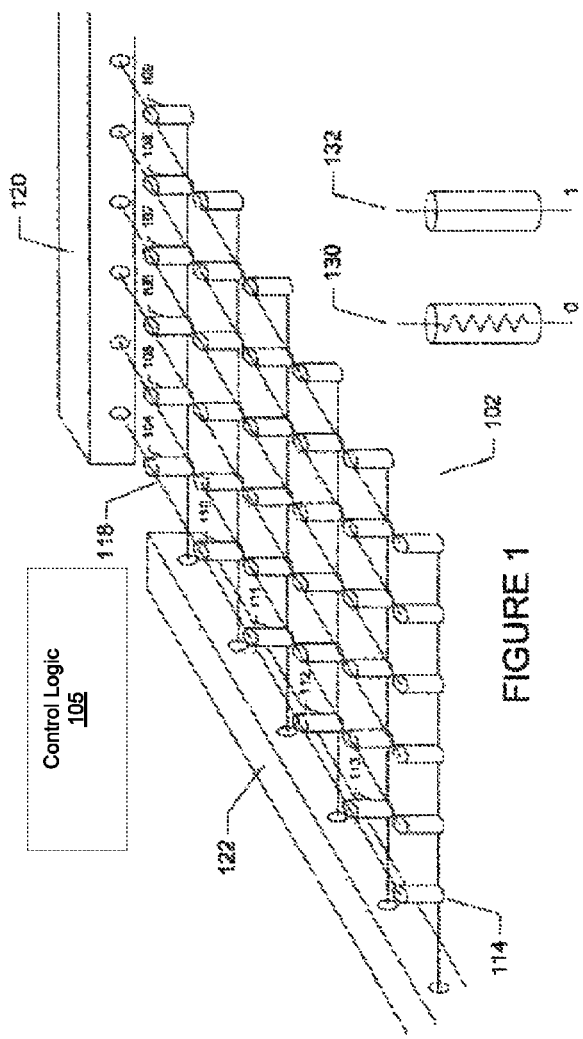
FIG. 1 illustrates a new type of electronic memory that has been recently developed.

FIG. 1 illustrates a new type of electronic memory that has been recently developed. The device shown in FIG. 1 is a two-dimensional array of memory elements, each element of which, such as element 102, can store a single bit of information. The two-dimensional array comprises rows of memory elements, each connected to a row signal line, such as the row of memory elements 104-109 in FIG. 1, and columns of memory elements, each column of memory elements interconnected through a column signal line, such as memory elements 104 and 110-114 in FIG. 1. The column signal lines emanate from a column demultiplexer 120 and the row signal lines emanate from a row demultiplexer 122. A given memory element can be accessed by controlling the voltage states of the column signal line and row signal line to which the memory element is connected. In modern resistor-based or memristor-based memory arrays, the memory elements may reside in one of at least two different states 130 and 132 distinguishable by the electrical resistance of the memory element. For example, as shown in FIG. 1, when a memory element is in a relatively high-resistance, low-conductance state 130, the memory element is considered to store a bit value "0;" and when the memory element is in a relatively low-resistance, high-conductance state 132, the memory element is considered to store the bit value "1." Of course, the opposite convention can be used in alternative devices.

Figure 2:
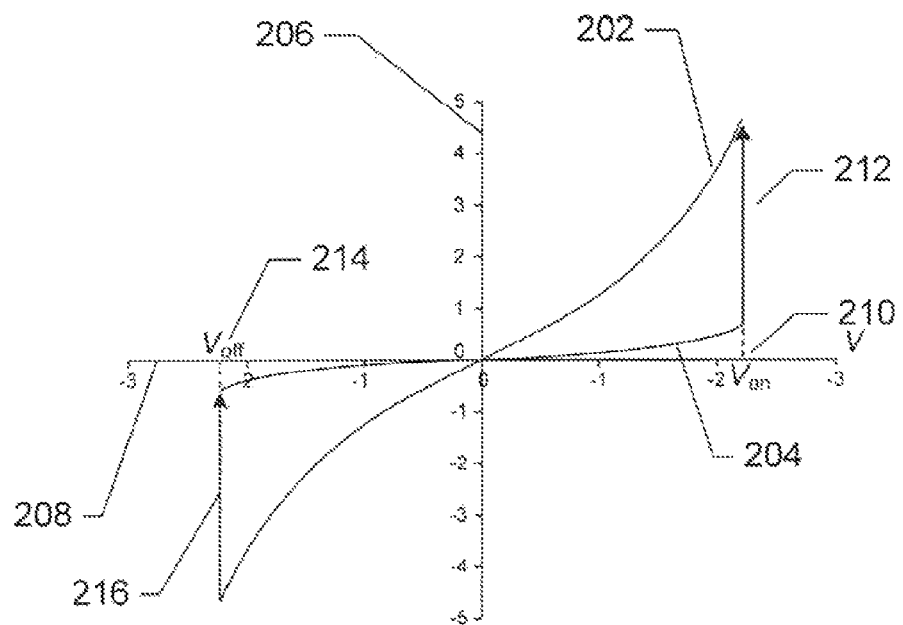
FIG. 2 shows a plot of voltage versus current for a memristive memory element.

FIG. 2 shows a plot of voltage versus current for a memristive memory element. A memristive memory element, is characterized by two different physical states: (1) a relatively high-conductance state, represented by curve 202 in FIG. 2; and (2) a relatively low-conductance state, represented by curve 204 in FIG. 2. Note that, in both FIGS. 2 and 3, current is plotted with respect to a vertical axis 206 and voltage is plotted with respect to horizontal axis 208. As can clearly be seen in FIG. 2, the current-versus-voltage curves 202 and 204 are generally nonlinear. When a positive voltage $V_{ON}$ 210 is applied to the memristive memory element, the physical state of the memristive element abruptly changes, as represented by vertical arrow 212 in FIG. 2, from the relatively low-conductance state, represented by curve 204, to the relatively high-conductance state represented by curve 202. When a negative voltage $V_{OFF}$ 214 is applied to the memristive memory element, the state of the memristive element abruptly changes, represented by vertical arrow 216 in FIG. 2, from the relatively high-conductance state, represented by curve 202, to the relatively low-conductance state, represented by curve 204.

A memristive memory element can serve as a storage, element for a single binary value, or bit. In one convention, the high-conductance state represents the bit value "1" and the low-conductance state represents, the bit value "0." Of course, an opposite convention can also be used. Generally, an interrogation voltage of relatively small magnitude, such as a positive voltage greater than 0 but less than $V_{ON}$ or a negative voltage greater than $V_{OFF}$ and less than 0, is used to determine the physical state of the memristive memory element, referred to below as the "data state" of the memristive memory element, by measuring the current that passes through the memristive memory element when the interrogation voltage, $V_{READ}$, is applied to the memristive memory element. The voltage $V_{ON}$ is applied to the memristive memory element in order to write the bit value "1" into the memory element, subsequently referred to as $V_{WRITE-1}$, and the voltage $V_{OFF}$ is applied to the memristive memory element in order to write the value "0" into the memristive memory element, subsequently referred to as $V_{WRITE-0}$. Again, depending on which bit-value convention is used, either one of $V_{WRITE-1}$ or $V_{WRITE-0}$ is generally positive, and the other of the two voltages is generally negative. For purposes of illustrating the present invention, it can be assumed that $V_{WRITE-1}$ is a positive voltage and $V_{WRITE-0}$ is a negative voltage, as shown in FIG. 2. Voltages of magnitudes greater than $V_{WRITE-4}$ or $V_{WRITE-0}$ are generally avoided, because they can destroy the memristive memory element, and the magnitude of the interrogation voltage is generally significantly less than the magnitudes of $V_{WRITE-1}$ or $V_{WRITE-0}$, so that READ operations do not contribute to physical-state drift, discussed below.

Figure 3:
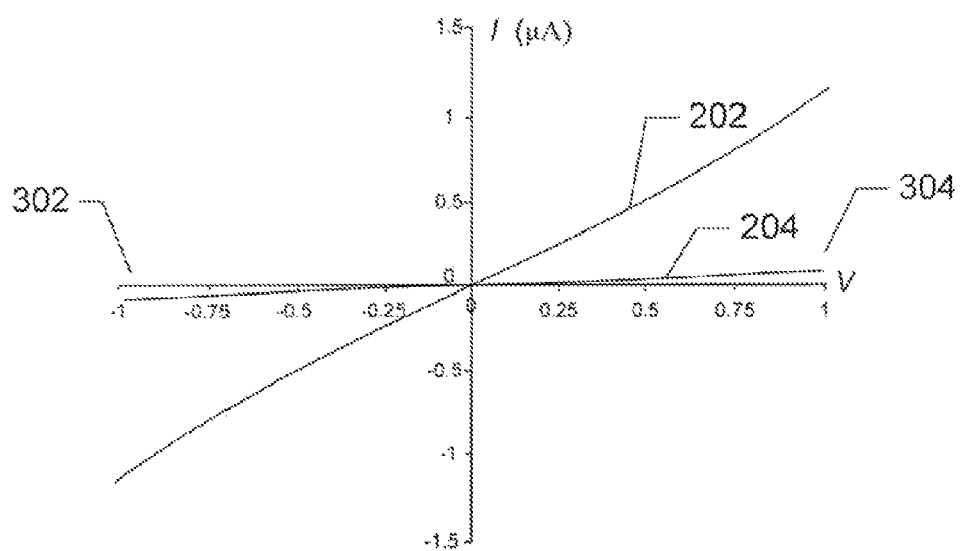
FIG. 3 shows the lower-voltage portion of the graph shown in FIG. 2.

FIG. 3 shows the lower-voltage portion of the graph shown in FIG. 2. As shown in FIG. 3, in the voltage range of −1V (302 in FIG. 3) to 1V (304 in FIG. 3), the current-versus-voltage curves 202 and 204 appear fairly linear. In general, memristive memory elements exhibit near-linear current-versus-voltage curves within a range of voltages of low magnitudes.

Were memristive memory elements perfectly stable and reliable, both in manufacture and during use, then applying the interrogation voltage $V_{READ}$ across a memristive memory element, measuring the current passing through the memristive memory element at that voltage, and computing the conductance of the memory element from the measured current and known voltage $V_{READ}$, where the conductance corresponds to the slope of the current-versus-voltage curves in FIGS. 2 and 3, would generate one of two fixed conductance values $G_0$ and $G_1$ corresponding to data states "0" and "1." Of course, in any measurement, it is expected that the measured value will fall within some range of values about a value corresponding to the physical characteristic being measured. Nonetheless, when the slopes of the two current-versus-voltage curves corresponding to the two physical states of a memristive memory element are sufficiently different, and stable over time and over multiple READ and WRITE accesses, it would be expected that the data state of the memristive memory element would, be reliably ascertained each time the voltage $V_{READ}$ was applied to the memristive memory element, the current passing through the memristive memory element was measured, and the conductance of the memristive memory element determined. However, as with most physical devices, memristive memory elements, particularly nanoscale memristive memory elements, do not exhibit ideal characteristics. Instead, there tend to be inconsistencies in manufacture, leading to differences in the current-versus-voltage characteristics of individual nanoscale memristive memory elements, and the physical characteristics of memristive memory elements tend to drift, over time. As one example of this drift, the measured conductance of the relatively high-conductance and relatively low-conductance states may change over time as well as after repeated READ and WRITE operations.

Figure 4:
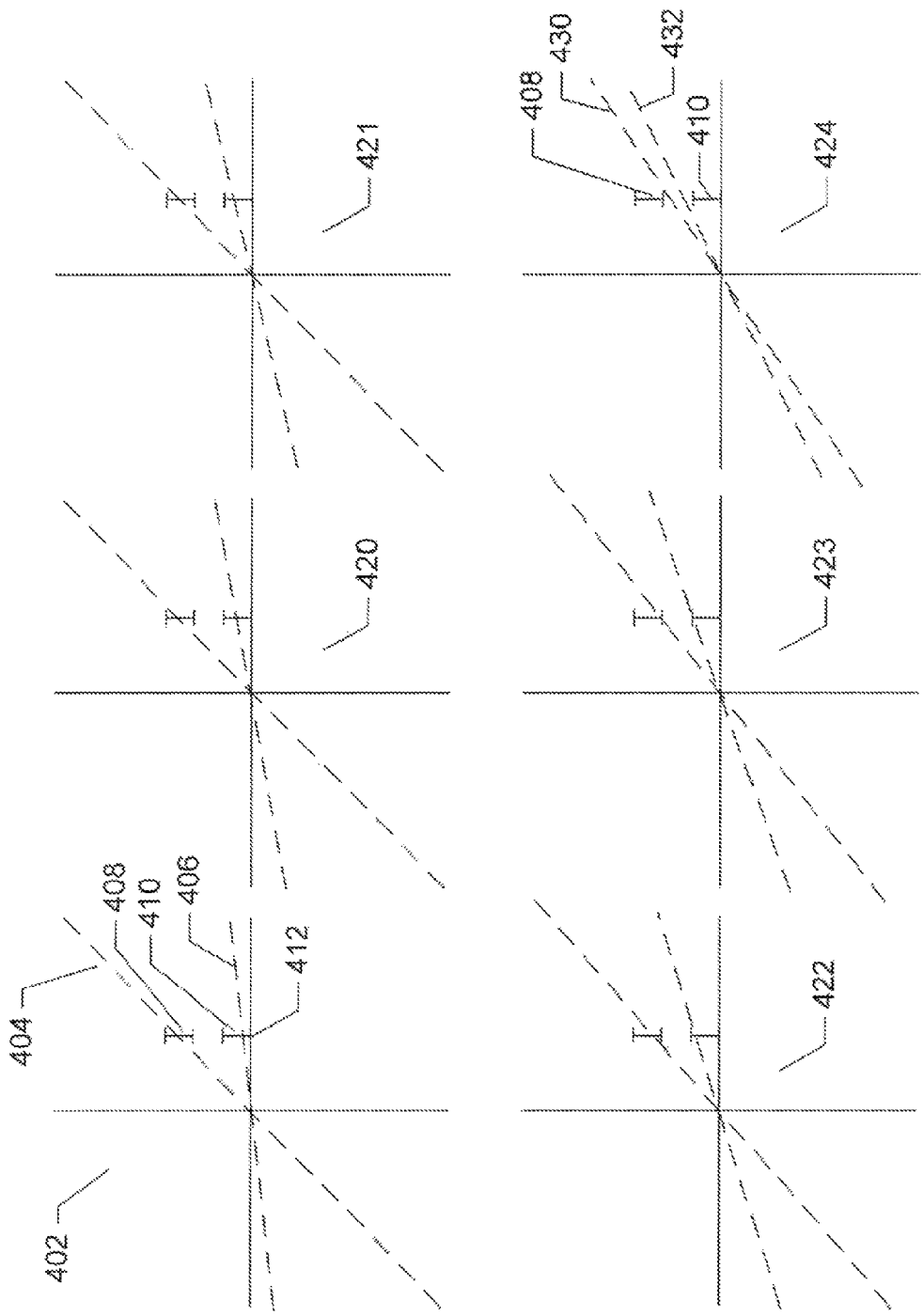
FIG. 4 illustrates, using the illustration conventions employed in FIG. 3, drift of the physical characteristics of a memristive memory element.

FIG. 4 illustrates, using the illustration conventions employed in FIG. 3, drift of the physical characteristics of a memristive memory element. The initial characteristics of the memristive memory element are shown in graph 402, with the current-versus-voltage curve 404 of the relatively high-conductance state and the current-versus-voltage curve 406 of the relatively low-conductance state shown as straight, dashed lines. In graph 402, vertical bars 408 and 410 represent the measured current ranges expected when the voltage $V_{READ}$ 412 is applied to the memristive memory element in the two physical states, or data states "1" and "0." Subsequent graphs 420-424 illustrate drift of the physical characteristics of the memristive memory element over time and/or over repeated access through applications of one or more of voltages $V_{READ}$, $V_{WRITE-1}$ and $V_{WRITE-0}$ while current passing through the memristive memory element is measured. Note that, over time, in the hypothetical case illustrated in FIG. 4, the conductance of the relatively-low-conductance state increases and the conductance of the relatively-high-conductance state decreases, to the extent that, in the final graph 424, neither the relatively-high-conductance-state curve 430 or the relatively-low-conductance-state curve 432 intersects with the current ranges 408 and 410 that were expected with respect to the initial conductance values of the two physical states of the memristive element, as shown in graph 402. This represents a significant problem. Initially, a measurement of the current passing through the memristive memory element upon application of voltage $V_{READ}$ would be expected to generate a value that falls within one of the two ranges 408 and 410. However, once the physical state of the memristive memory element has drifted to the point illustrated in graph 424, it is likely that current value measured upon application of the voltage $V_{READ}$ will generate a current value outside of the current ranges 408 and 410, regardless of which conductance state the memristive memory element is currently in.

The problem illustrated in FIG. 4 might be addressed in various different ways. For example, one might attempt to generate theoretical curves for physical-state daft, and design the memristive-memory-element-access logic within electronic memories to make memristive-memory-element-state determinations based both on the currently measured conductance of the memristive memory element as well as the theoretical drift curve. However, such an approach would be highly error-prone, since the physical drift for individual memristive memory elements may differ markedly from one another, and because of the difficulty in keeping track of the extent to which individual memristive memory elements have been accessed and/or the time that has elapsed since manufacture. As another approach, the conductance of the two different physical states of each memristive memory element in an electronic memory could be periodically measured, and the information stored; in order to continuously recalibrate memristive memory elements for subsequent access. However, such an approach would be time-consuming, require a large amount of additional memory, and potentially extremely disruptive with respect to normal operation of the computational system or device in which electronic memory is incorporated.

In one embodiment of the present invention, determining the data state of a memristive memory element is carried out by first reading and storing the initial conductance of the memristive memory element, $G_x$, representing an unknown data state, then setting the memristive memory element to data state "1," reading the conductance of the memory element in data state "1," $G_1$, and storing that value, setting the data state of the memristive memory element to data state "0," reading and storing the conductance of the memristive memory element in data state "0," $G_0$, and then computing the most likely data state corresponding to the initially read conductance $G_x$.

Figure 5B:
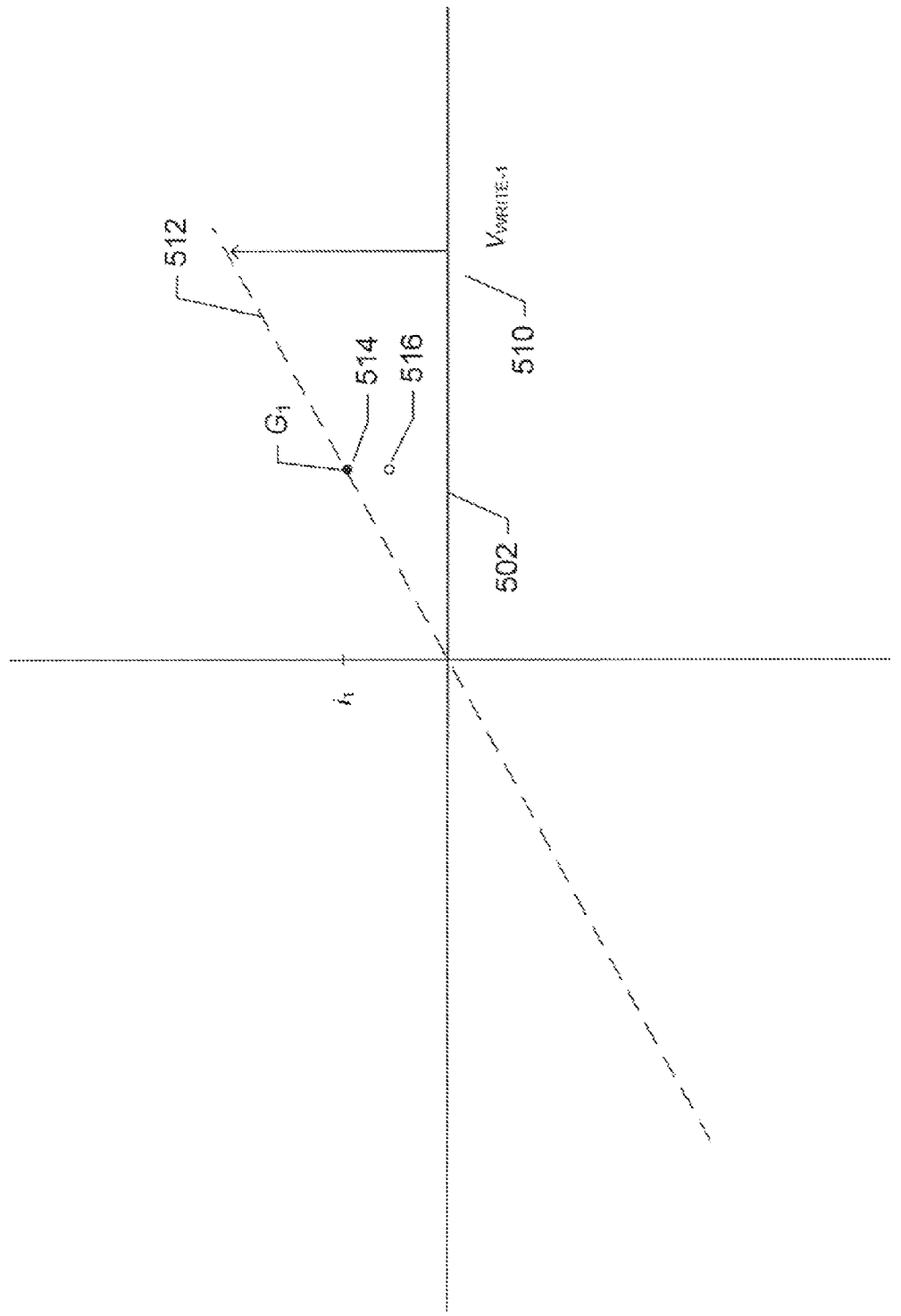
Figure 5C:
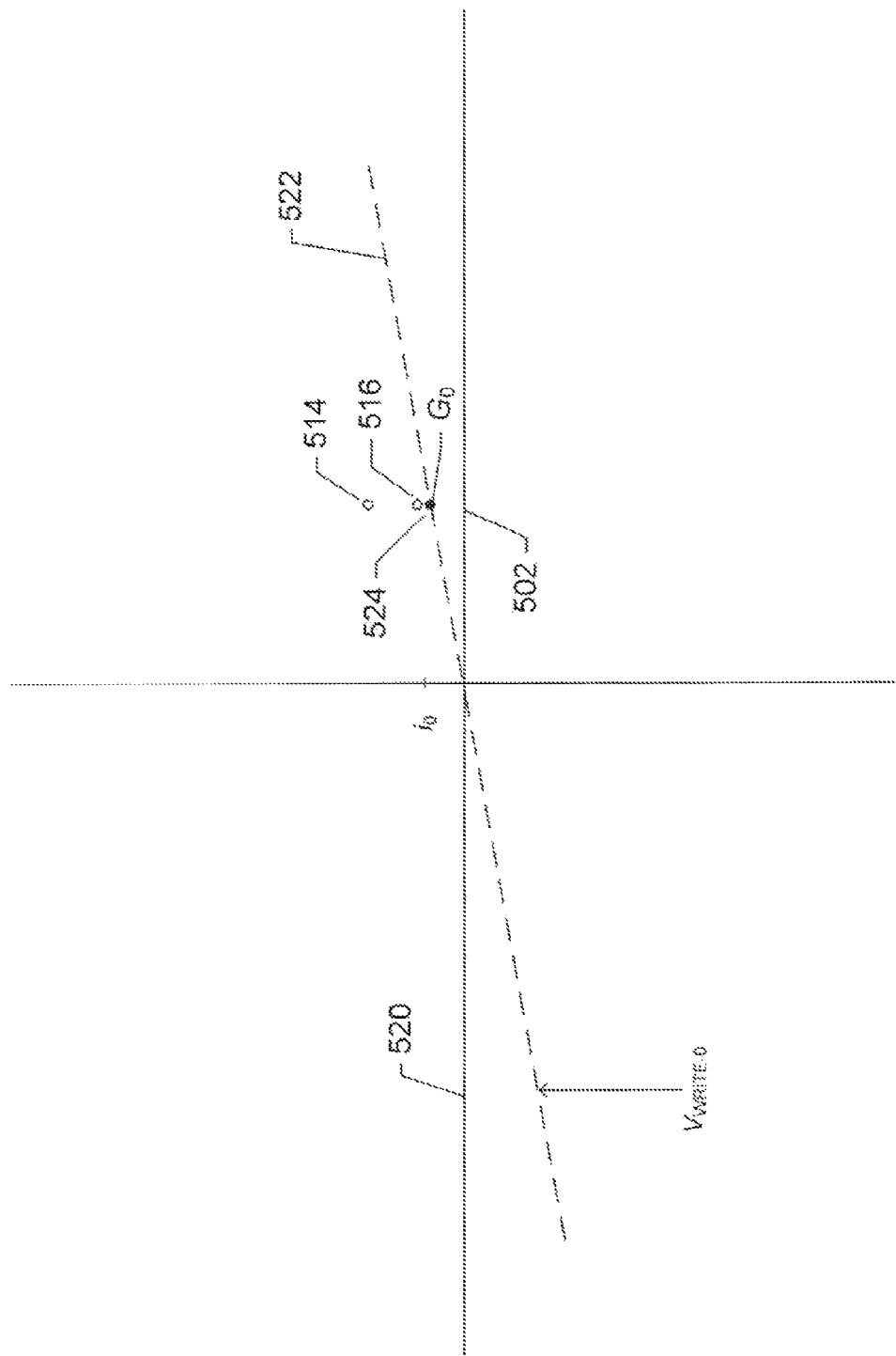

FIGS. 5A-C illustrate a data-state-determination operation that represents one embodiment of the present invention. FIGS. 5A-C use the same illustration conventions as used in FIGS. 2-4. In FIG. 5A, the interrogation voltage, $V_{READ}$, 502 is applied to the memristive memory element in an unknown data state in order to measure the current $i_x$ 504 passing through the memristive memory element at voltage $V_{READ}$, allowing a determination of the conductance $G_x$ 506 of the memristive memory element in the unknown data state. The value $G_x$ is stored by logic circuitry (e.g., control logic 105, FIG. 1) or under firmware or software control for subsequent computational determination of the unknown data state. Next, as shown in FIG. 5B, a voltage $V_{WRITE-1}$ 510 is applied to the memristive memory element in order to place the memristive memory element into the relatively high-conductance physical state, represented by curve 512 in FIG. 5B. Then, the interrogation voltage $V_{READ}$ 502 is again applied to the memristive memory element and the conductance of the memristive memory element, now known to be in data state "1," $G_1$ 514, is determined. Note that the measured conductance $G_x$ is shown as a dashed point 516 in FIG. 5B, while conductance $G_1$ is shown as a filled disk. Then, as shown in FIG. 5C, a voltage $V_{WRITE-0}$ 520 is applied to the memristive memory element in order to place the memristive memory element into the data state "0," represented by curve 522 in FIG. 5C. Then, the interrogation voltage $V_{READ}$ 502 is again applied to the memristive memory element and the conductance $G_0$ 524 is determined. At this point, three conductances, $G_0$ 524, $G_x$ 516, and $G_1$ 514, have been determined and stored for computation. Conductances $G_1$ and $G_0$ can be considered to be calibration values for the memory element that are obtained close in time to acquisition of the measured conductance $G_x$ corresponding to the unknown data state.

FIGS. 6A-C illustrate three different possible orderings of the magnitudes of the determined conductances $G_x$, $G_0$, and $G_1$, discussed above with reference to FIGS. 5A-C, obtained during a data-state-determination operation that represents one embodiment of the present invention. FIG. 6A shows the most frequently encountered ordering of the three different determined conductances, corresponding to the ordering shown in FIG. 5C. In this ordering, the conductance $G_x$ 602, determined for an initial, unknown data state of the memristive memory element, falls between the determined conductances $G_0$ 604 and $G_1$ 606 corresponding to the conductances of the data states "0" and "1," respectively, which are determined immediately after determination of the conductance of the unknown data state $G_x$. Three different differences between pairs of the three conductances $G_x$, $G_0$, and $G_1$, $d_0$ (606 in FIG. 6A), $d_1$ (608 in FIG. 6A), and $d_{10}$ (610 in FIG. 6A) respectively, are computed by taking the absolute value of the differences between all possible pairs of the determined conductances $G_x$, $G_0$, and $G_1$. From these values, the initial data state of the memristive memory element, for which the conductance $G_x$ was initially determined, can be assigned to a measured or computed data state ms as follows:

$$ms = \begin{cases} 1, & \text{when } d_1 < d_0 \\ 0, & \text{otherwise} \end{cases}$$

In addition, a reliability metric, an be determined for the computed data state ms as being proportional to $d_{10}$ and inversely proportional to either $d_0$ or $d_1$.

FIGS. 6B and 6C show different orderings of the three measured conductances $G_0$, $G_1$, and $G_x$ in which $G_x$ falls below $G_0$ or above $G_1$. In these cases, a more general method for determining the value of ins is needed. One general method for determining the value of ms that can be applied in all three cases shown in FIGS. 6A-C, using the arithmetic mean of $G_0$ and $G_1$, $M_{arith}$, is:

$$M_{arith} = \frac{G_1 + G_0}{2}$$

$$ms = \begin{cases} 1, & \text{when } G_1 \geq M_{arith} \\ 0, & \text{otherwise} \end{cases}$$

There are a variety of different ways to generate a general reliability metric R. In a first, exemplary method for computing a reliability metric R, nominal values $\hat{G}_0$ and $\hat{G}_1$ for the conductances of a memristive memory element in the "0" and "1" data states are employed. These nominal values may be average values determined for memristive memory elements of a particular type or computed values that, take into account one or more of various device-type, time-since-manufacture, and accumulated-use parameters. In addition, a bounded measured conductance $G'_x$ is employed. The value, of the bounded measured conductance $G'_x$ is restricted to fall within the interval $[G_0, G_1]$. The R metric can be computed as:

$$G'_x = \begin{cases} G_1, & \text{when } G_x > G_1 \\ G_0, & \text{when } G_x < G_0 \\ G_x, & \text{otherwise} \end{cases}$$

$$R = \left( \frac{2|M_{arith} - G'_x|}{G_1 - G_0} \right) \left( \frac{G_1 - G_0}{\hat{G}_1 - \hat{G}_0} \right) = \frac{2|M_{arith} - G'_x|}{\hat{G}_1 - \hat{G}_0}$$

As shown above, R can be considered to be computable as a product of a first term and a second term. The first term represents the distance of the determined, bounded conductance $G'_x$ from the arithmetic mean of $G_0$ and $G_1$, $M_{arith}$, relative to the difference $G_1-G_0$. For given values of $G_0$ and $G_1$, the first term is greatest when the numerator of the first term, twice the distance of $G'_x$ from $M_{arith}$, is large in relation to the difference $G_1-G_0$, which represents the maximum possible value for the numerator of the first term. The first term thus ranges in value from 0 to 1, with 0 representing no confidence in the value assigned to ms and 1 representing highest confidence in the value assigned to ms. The second term represents the most recently measured conductivity difference between data states "0" and "1" relative to the nominal, designed, or initial post-manufacture conductivity difference between data states "0" and "1." As the difference $G_1-G_0$ decreases relative to $\hat{G}_1-\hat{G}_0$, the reliability of a determination of the data state based, on measured conductance decreases. The denominator of the first term and numerator of the second term cancel, in the product, leaving the value of R computed, in one term, as twice the distance from $G'_x$ to the arithmetic mean $M_{arith}$ relative to the difference between nominal conductances $\hat{G}_1$ and $\hat{G}_0$. It should be noted that, since conductance is proportional to current, at a given applied voltage, the magnitude of the currents, rather than the conductances, can be used to determine the data state of a memory element.

An alternative method for determining ms and R is based on the geometric mean of $G_0$ and $G_1$, $M_{geo}$, and ion logarithms of conductance values:

$$\log(M_{geo}) = \frac{\log(G_1) + \log(G_0)}{2}$$

$$ms = \begin{cases} 1, & \text{when } \log(G_x) \geq \log(M_{geo}) \\ 0, & \text{otherwise} \end{cases}$$

$$G'_x = \begin{cases} G_1, & \text{when } G_x > G_1 \\ G_0, & \text{when } G_x < G_0 \\ G_x, & \text{otherwise} \end{cases}$$

$$R = \frac{2|\log(M_{geo}) - \log(G'_x)|}{\log(\hat{G}_1) - \log(\hat{G}_0)}$$

This alternative method may better express a reliability in terms of commonly employed metrics for device quality. An advantage of this method is that it depends on the ratio $\hat{G}_1/\hat{G}_0$ rather than on absolute nominal conductance values.

Alternatively, the reliability metric R may be computed, by various means, as the probability that the determined data, state ins corresponds to the initial data state of the memristive memory element, prior to the data-state-determination process, given the measured conductance values $G_0$, $G_1$, and $G_x$:

$$R = P(\text{initial memristor data state} = ms | G_1, G_0, G_x)$$

Many other possible techniques for computing both ms and R are possible. As one example, assuming that ms and R are initially computed by an above-described method, a final value of ms, $ms_f$, can be computed as:

$$ms_f = \begin{cases} 1, & \text{when } ms = 1 \text{ AND } R > R_T \\ 0, & \text{when } ms = 0 \text{ AND } R > R_T \\ ?, & \text{otherwise} \end{cases}$$

where $R_T$ is a threshold $R$ value

Similarly, $ms_f$ may be alternatively computed as:

$$ms_f = \begin{cases} 1, & \text{when } ms = 1 \text{ AND } \frac{d_1}{d_0} < t \\ 0, & \text{when } ms = 0 \text{ AND } \frac{d_0}{d_1} < t \\ ?, & \text{otherwise} \end{cases}$$

where $t$ is a threshold value

In both cases, the final determined data state can be either "1," "0," or "?." The data state, "?," corresponds to an erasure. An erasure occurs either because of deterioration of the physical characteristics of the memristive memory element, problems with conductance determination during the data-state-determination operation, manufacturing defects, and for other reasons.

A data-state-determination operation, or enhanced READ operation, that represents one embodiment of the present invention, by returning either a reliability metric R or one of three values corresponding to a three-value data state, in which one value corresponds to the data state "erasure," or "?," can facilitate application of various error-control coding techniques to electronic memories based on memristive memory elements in order to increase the reliability of the electronic memories. Error-control coding techniques involve including additional, redundant stored data in an electronic memory along with input data. Many error-control coding techniques include logic for encoding input data into codewords that include redundant data, to allow a certain number of errors in a retrieved code word to be detected and corrected, thus ameliorating failures or unreliability in a number of memristive memory elements used to store the codeword. Error-correcting codes can, in general, correct a greater number of erasure-type anomalies, for a given amount of redundancy, than errors that interchange data states "0" and "1." For this reason, a data-state-determination operation of the present invention which returns either a three-value computed data state, $ms_f$, as discussed above with reference to FIGS. 6A-C, or that returns a determined, data state ms along with a reliability metric R, can facilitate error-control coding by distinguishing erasure events from bit-inversion events. The reliability metric can additionally serve as soft information to facilitate soft-decision decoding that provides stronger error-correcting-code-based methods for a given amount of redundancy than error-correcting-code-based methods in which a hard, binary decision is made with the respect to a value retrieved from a memory element. The reliability metric R can be additionally be accumulated from memory-element accesses and used to monitor the reliability of an electronic memory, and can be used for many other purposes.

Figure 7:
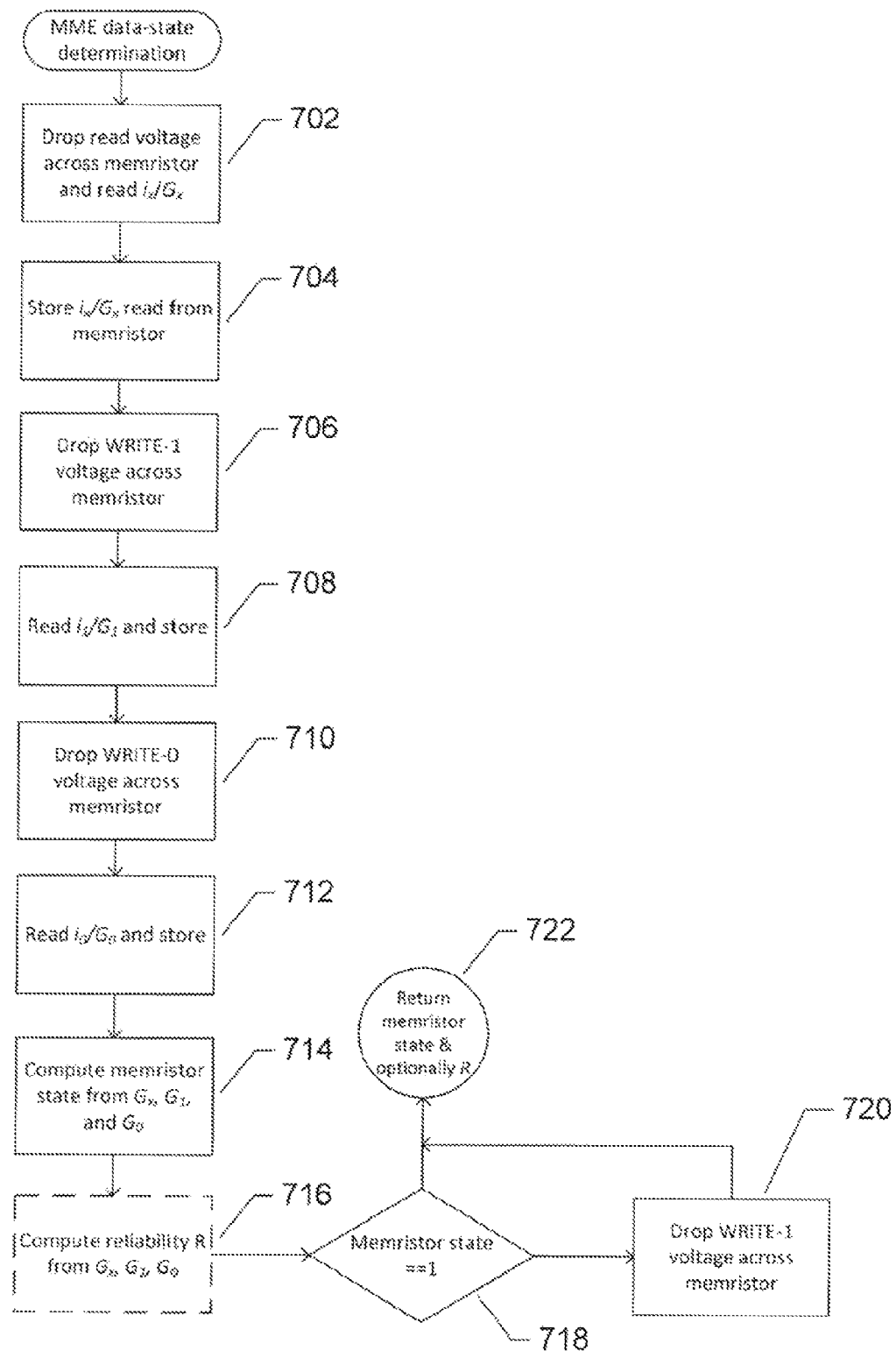
FIG. 7 provides a control-flow diagram that illustrates one embodiment of the data-state-determination method that represents one embodiment of the present invention.

FIG. 7 provides a control-flow diagram, that illustrates one embodiment of the data-state-determination method that represents one embodiment of the present invention. This method is incorporated within electronic memories that represent certain electronic-memory embodiments of the present invention. In step 702, the interrogation voltage $V_{READ}$ is applied to a memristive memory element in order to measure the current $i_x$ and determine the conductance $G_x$, as discussed above with reference to FIGS. 5A-C. Next, in step 704, one or both of $i_x$ and $G_x$ are stored for subsequent calculation. In step 706, the memristive memory element is placed into the data state "1," and in step 708, the conductance $G_1$ is determined and stored, as discussed above with reference to FIGS. 5A-C. Similarly, in steps 710 and 712, the memristive memory element is placed into the data state "0" and the corresponding conductance $G_0$ determined and stored. Next, in step 714, a memory state ms or $ms_f$ is computed from $G_x$, $G_1$, and $G_0$, as discussed above with reference to FIGS. 6A-C. Optionally, the reliability metric R can be computed, in step 716. In the case of computation of a three-way data state $ms_f$ computing ms and R may be needed before $ms_f$ is computed in an additional step after step 716. In step 718, when the initial, unknown memristive memory element state is determined to have been data state "1," the memristive memory element is placed back into data state "1" by a WRITE operation in step 720. Finally, the computed initial data state ms and, optionally, the reliability metric R are returned 722. Alternatively, the computed data state $ms_f$ may be returned in step 722.

Although the present invention has been described in terms of particular embodiments, it is not, intended that the invention be limited to these embodiments. Modifications will be apparent to those skilled in the art. For example, as discussed above, different conventions can be used to assign data states "0" and "1" to different physical memristive memory element data of physical states, and the above-discussed data-state-determination operation accordingly modified. The memristive-memory-element of a data-state-determination operation is generally embodied within circuits or circuits and firmware or software control features of an electronic memory. Thus, a memory element within an electronic memory that implements the data-state-determination operation that represents one embodiment of the present invention itself represents a memory-element embodiment of the present invention, and the electronic memory represents a memory-embodiment of the present invention. In certain embodiments of the present invention, the data state of a memory element is determined by placing the memory element in a single known data state and determining the value of a physical characteristic of the memory element to compare with an initially determined value of the physical characteristic of the memory element The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. An electronic memory comprising:
   a memory element; and
   control logic that determines a data state of the memory element by
   measuring a physical characteristic of the memory element to obtain a measured value corresponding to the data state,
   measuring the physical characteristic of the memory element, after setting the memory element to a first known data state, to obtain a first calibration value, and
   measuring the physical characteristic of the memory element, after setting the memory element to a second known data state, to obtain a second calibration value;
   wherein the data state is determined by comparing the first measured value with the first and second calibration values.

2. The electronic memory of claim 1 wherein the memory element is a memristor.

3. The electronic memory of claim 1 wherein the physical characteristic is one of:
   a magnitude of a current that passes through the memory element when a voltage $V_{READ}$ is applied across the memory element;
   a resistance to current flow when a voltage $V_{READ}$ is applied across the memory element; and
   a conductance of the memory element to current flow when a voltage $V_{READ}$ is applied across the memory element.

4. The electronic memory of claim 1 further including:
   determining the mean of the first and second calibration values;
   when the first measured value is greater than the mean, determining the data state to be the data state for which the corresponding calibration value is greater than the mean; and
   when the first measured value is less than the mean, determining the data state to be the data state for which the corresponding calibration value is less than the mean.

5. The electronic memory of claim 4 wherein the reliability metric is determined by:
   when the first measured value is greater than the first calibration value and the first measured value is greater than the second calibration value, determining a bounded measured value to be the value of first calibration value when the first calibration value is greater than the second calibration value and otherwise determining the bounded measured value to be the value of second calibration value;
   when the first measured value is less than the first calibration value and the first measured value is less than the second calibration value, determining the bounded measured value to be the value of first calibration value when the first calibration value is less than the second calibration value and otherwise determining the bounded measured value to be the value of second calibration value;
   when the first measured value falls between the first and second calibration values, determining the bounded measured value to be the first measured value; and
   determining the reliability metric to be proportional to a distance of the bounded measured value from the mean and inversely proportional to a positive difference between nominal calibration values.

6. The electronic memory of claim 4 wherein the first measured value and the first and second calibration values are one of:
   conductance values; and
   logarithms of conductance values.

7. The electronic memory of claim 4 wherein the reliability metric reflects a probability that the determined data state is correct.

8. The electronic memory of claim 1, wherein said control logic is programmed to determine a reliability metric for the determined data state.

9. The electronic memory of claim 8, wherein said reliability metric comprises a value between 0 and 1, with a higher value indicating greater reliability.

10. The electronic memory of claim 1, wherein said control logic, after determining the data state, is programmed to write the determined data state to the memory element.

11. An electronic memory comprising:
    a plurality of memory elements; and
    control logic that, upon receiving a READ command, determines a data state of one of the memory elements by
    measuring a physical characteristic of the memory element to obtain a measured value corresponding to the data state,
    measuring the physical characteristic of the memory element, after setting the memory element to a first known data state, to obtain a first calibration value,
    comparing the measured value corresponding to the data state with the first calibration value to determine the data state as one of a first known data state, a second known data state, and an erasure data state, and
    determining a reliability metric for the determined data state.

12. The electronic memory of claim 11 wherein the physical characteristic is one of:
    a magnitude of a current that passes through a memory element when a voltage $V_{READ}$ is applied across the memory element;

a resistance to current flow when a voltage $V_{READ}$ is applied across the memory element; and a conductance of the memory element to current flow when a voltage $V_{READ}$ is applied across the memory element.

13. The electronic memory of claim 11, wherein said control logic is further programmed to use said determined data state to distinguish between erasure events and bit-inversion events for error-control coding.

14. A method for determining a data state of a memory element, the method comprising:

measuring a physical characteristic of the memory element to obtain a measured value corresponding to the data state;

measuring the physical characteristic of the memory element, after setting the memory element to a first known data state, to obtain a first calibration value;

comparing the measured value corresponding to the data state with the first calibration value to determine the data state; and determining a reliability metric for the determined data state.

15. The method of claim 14 wherein the physical characteristic is one of:

a magnitude of a current that passes through the memory element when a voltage $V_{READ}$ is applied across the memristor;

a resistance to current flow when a voltage $V_{READ}$ is applied across the memristor; and a conductance of the memory element to current flow when a voltage $V_{READ}$ is applied across the memristor.

16. The method of claim 15 further including:

measuring the physical characteristic of the memory element, after setting the memory element to a second known data state, to obtain a second calibration value and determining the data state by comparing the first measured value with the first and second calibration values.

17. The method of claim 16 further including:

determining the mean of the first and second calibration values;

when the first measured value is greater than the mean, determining the data state to be the data state for which the corresponding calibration value is greater than the mean; and when the first measured value is less than the mean, determining the data state to be the data state for which the corresponding calibration value is less than the mean.

18. The method of claim 17 further including determining the reliability metric by:

when the first measured value is greater than the first calibration value and the first measured value is greater than the second calibration value, determining a bounded measured value to be the value of first calibration value when the first calibration value is greater than the second calibration value and otherwise determining the bounded measured value to be the value of second calibration value;

when the first measured value is less than the first calibration value and the first measured value is less than the second calibration value, determining the bounded measured value to be the value of first calibration value when the first calibration value is less than the second calibration value and otherwise determining the bounded measured value to be the value of second calibration value;

when the first measured value falls between the first and second calibration values, determining the bounded measured value to be the first measured value; and determining the reliability metric to be proportional to a distance of the bounded measured value from the mean and inversely proportional to a positive difference between nominal calibration values.

19. The method of claim 14, further comprising writing the determined data state to the memory element from which the measured value was measured.

20. The method of claim 14, wherein said reliability metric comprises a value between 0 and 1, with a higher value indicating greater reliability.

* * * * *